US011566990B2

(12) United States Patent
Lin et al.

(10) Patent No.: US 11,566,990 B2
(45) Date of Patent: Jan. 31, 2023

(54) DERIVATIVES OF SPECTRAL AEROSOL OPTICAL DEPTH FOR PARTITIONING TYPE AND LOADING

(71) Applicant: National Central University, Taoyuan (TW)

(72) Inventors: Tang-Huang Lin, Taoyuan (TW); Wei-Hung Lien, New Taipei (TW)

(73) Assignee: National Central University, Taoyuan (TW)

( * ) Notice: Subject to any disclaimer, the term of this patent is extended or adjusted under 35 U.S.C. 154(b) by 36 days.

(21) Appl. No.: 17/400,188

(22) Filed: Aug. 12, 2021

(65) Prior Publication Data

US 2022/0412864 A1 Dec. 29, 2022

(30) Foreign Application Priority Data

Jun. 24, 2021 (TW) ................................ 110123194

(51) Int. Cl.
*G01N 15/02* (2006.01)
*G01N 21/3504* (2014.01)
*G06F 30/20* (2020.01)

(52) U.S. Cl.
CPC ..... *G01N 15/0211* (2013.01); *G01N 21/3504* (2013.01); *G06F 30/20* (2020.01)

(58) Field of Classification Search
CPC .................................................. G01N 15/0211
See application file for complete search history.

(56) References Cited

PUBLICATIONS

O'Neill et al. "Bimodal size distribution influences on the variation of Angstrom derivatives in spectral and optical depth space," Journal of Geophysical Research, vol. 106, No. D9, pp. 9787-9806. (Year: 2001).*
Tang-Huang Lin et. al., "Spectral Derivatives of Optical Depth for Partitioning Aerosol Type and Loading" Remote Sens. 2021, 13, 1544.

* cited by examiner

*Primary Examiner* — Rebecca C Bryant
(74) *Attorney, Agent, or Firm* — Demian K. Jackson; Jackson IPG PLLC

(57) ABSTRACT

A spectral method is provided for partitioning type and loading with aerosol optical depth. Based on multi-spectral optical aerosol depth, particle-size distribution and refractive index are derived by normalizing first- and second-order derivatives for processing quantitative calibration of main components. According to the optical feature parameters of various aerosol types, a radiation theory is applied to simulate multi-spectral optical depth for each density, including those of mixed types. The intrinsic parameters of aerosol types are figured out by constructing normalized derivative aerosol indices (NDAI). The clear characteristic differences between aerosol types are used to figure out main components of aerosols and their mixing ratios. The simulation result of the normalized index of various aerosol type is in good agreement with the ground observation data of Aerosol Robotic Network. It shows that NDAI is quite practicable in quantitative calibration of main components of atmospheric aerosol.

5 Claims, 17 Drawing Sheets

(a)

(b)

DERIVATIVES OF SPECTRAL AEROSOL OPTICAL DEPTH FOR PARTITIONING TYPE AND LOADING

TECHNICAL FIELD OF THE INVENTION

The present invention relates to partitioning aerosol type and loading; more particularly, to using normalized derivative aerosol index (NDAI) to integrate data of theoretical simulation and actual observation for examining various aerosol types with the relationships of particle-size distributions and complex refractive indices together with first- and second-order derivatives of spectral aerosol optical depths (AOD), where optical intrinsic parameters of dust (DS), biomass burning (BB), and anthropogenic pollutants (AP) are constructed; and, thus, each single aerosol type is identified and main components of each mixed aerosol are quantitatively distinguished.

DESCRIPTION OF THE RELATED ARTS

According to the reports of the Intergovernmental Panel on Climate Change, since various aerosol types have different optical features, the variation range of global atmospheric aerosol radiative forcing is obviously larger than the average value following the changes in time and space; and it has a great influence on the accuracy in the radiative forcing assessment of aerosol. It also shows that various aerosol types, such as black carbon, the main component of BB, and sulfate and nitrate, the main components of AP, do not have equal influences on radiative forcing. Therefore, how to effectively distinguish various types of atmospheric aerosols and their contents is very important.

Satellite observation has the advantage of periodicity and wide range. If it can be applied to global or regional aerosol observation, it is helpful for the accurate assessment of aerosol radiative forcing. For assisting satellite in the inversion of aerosol parameters, the global AErosol RObotic NETwork (AERONET) provides inspections of various aerosol parameters in the atmosphere. At the same time, it is confirmed that the optical features of aerosols, such as spectral changes on particle-size distribution, single-scattering albedo (SSA), etc., obtained by observation for a long time can be used to identify aerosol types. But for the mixed aerosol types, a single type of parameter threshold does not meet the requirements for identification.

Previous research by Kaku et al. showed that not only multi-spectral optical parameters provide particle-size distribution, but also scattering and extinction coefficients are calculated theoretically by the spectral deconvolution algorithm (DSA+). Hansell et al. applied first- and second-order derivatives of high-spectral optical depth to successfully distinguish BB aerosol and cirrus clouds as showing the high correlation of their main components (types) to the spectral changes of AODs. The above are quite feasible for identifying and distinguishing aerosol types.

As a result, owing to the shortcomings in conventional technologies, there is an urgent need for improving the existing deficiencies by effectively constructing a set of optical intrinsic parameters of DS, BB, and AP for identifying each single aerosol type as well as quantitatively distinguishing main components of each mixed aerosol. Hence, the prior arts do not fulfill all users' requests on actual use.

SUMMARY OF THE INVENTION

The main purpose of the present invention is to apply first- and second-order derivatives obtained through multi-spectral AOD normalization for identifying and quantitatively distinguishing aerosol types.

Another purpose of the present invention is to obtain the potential of satellite application on providing global or regional distribution of aerosol type.

Another purpose of the present invention is to provide information of the temporal and spatial distribution of SSA having very scarce global observation data.

To achieve the above purposes, the present invention is a method of spectral AOD derivatives for partitioning type and loading, comprising steps of: (a) first step: based on optical feature parameters of various aerosol types, using a model of Second Simulation of a Satellite Signal in the Solar Spectrum (6S model) to calculate spectral AODs of the various aerosol types, where the various aerosol types comprises DS, BB, AP, and various mixtures of DS, BB, and AP; and (b) second step: based on the spectral AODs of the various aerosol types, processing calculation with NDAIs to obtain particle-size distributions and complex refractive indices derived from normalized first- and second-order derivatives of the spectral AODs of the various aerosol types to obtain intrinsic parameters of the various aerosol types to calculate main components of aerosols and mixing ratios thereof to identify each single type of aerosol and quantitatively distinguish main components of mixed aerosol.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
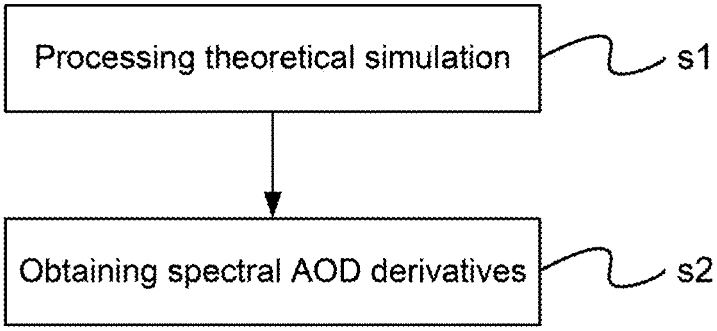
FIG. 1 is the view showing the preferred embodiment according to the present invention.

The following description of the preferred embodiment is provided to understand the features and the structures of the present invention.

Please refer to FIG. 1 to FIG. 8B, which are a view showing a preferred embodiment according to the present invention; a view showing spectral distributions of AODs; a view showing first-order derivatives of unnormalized AODs; a view showing first-order derivatives of normalized AODs; a view showing second-order derivatives of unnormalized AODs; a view showing second-order derivative of normalized AODs; a view showing unnormalized first-order parameters; a view showing normalized first-order parameters; a view showing unnormalized second-order parameters; a view showing normalized second-order parameters; a view showing unnormalized second-order derivatives of AOD intrinsic features; a view showing normalized second-order derivatives of AOD intrinsic features; a view showing a result integrating theoretical simulation and actual observation; a view showing a result integrating theoretical simulation and actual observation by normalized aerosol indices; a view showing normalized first- and second-order derivatives of data of ground observation and theoretical simulation; and a view showing component proportions of three representative aerosols. As shown in the figures, the present invention is a method of spectral AOD derivatives for partitioning type and loading, where a normalized derivative aerosol index (NDAI) is used to integrate data of theoretical simulation and actual observation for examining various aerosol types with the relationships of particle-size distributions and complex refractive indices together with first- and second-order derivatives of spectral AODs and constructing optical intrinsic parameters of dust (DS), biomass burning (BB), and anthropogenic pollutants (AP); and, thus, each single type of aerosol is identified and main components of each mixed aerosol are quantitatively distinguished. The present invention comprises the following steps:

(a) Processing theoretical simulation s1: Regarding a theoretical simulation, based on optical feature parameters of various aerosol types, a model of Second Simulation of a Satellite Signal in the Solar Spectrum (6S model) is used to calculate spectral aerosol optical depths (AOD) of the various aerosol types. The various aerosol types comprises DS, BB, AP, and various mixtures of DS, BB, and AP, where the main component of BB is black carbon and the main components of AP are sulfate and nitrate. Therein, the optical feature parameters of the various aerosol types are based on particle-size distributions and complex refractive indices of aerosols provided by the World Meteorological Organization (WMO). As listed in Table 1, $n_r$ and $n_i$ are the real number part and the imaginary number part of the complex refractive index, respectively; $R_{mean}$ is a geometric mean radius; and $R_{std}$ is a geometric standard deviation.

TABLE 1

| λ | DS | | AP | | BB | |
|---|---|---|---|---|---|---|
| (micrometer, μm) | $n_r$ | $n_i$ | $n_r$ | $n_i$ | $n_r$ | $n_i$ |
| 0.400 | 1.53 | 8.00E−03 | 1.53 | 5.00E−03 | 1.75 | 0.46 |
| 0.488 | 1.53 | 8.00E−03 | 1.53 | 5.00E−03 | 1.75 | 0.45 |
| 0.515 | 1.53 | 8.00E−03 | 1.53 | 5.00E−03 | 1.75 | 0.45 |
| 0.550 | 1.53 | 8.00E−03 | 1.53 | 6.00E−03 | 1.75 | 0.44 |
| 0.633 | 1.53 | 8.00E−03 | 1.53 | 6.00E−03 | 1.75 | 0.43 |
| 0.694 | 1.53 | 8.00E−03 | 1.53 | 7.00E−03 | 1.75 | 0.43 |
| 0.860 | 1.52 | 8.00E−03 | 1.52 | 1.20E−02 | 1.75 | 0.43 |
| 1.536 | 1.4 | 8.00E−03 | 1.51 | 2.30E−02 | 1.77 | 0.46 |
| 2.250 | 1.22 | 9.00E−03 | 1.42 | 1.00E−02 | 1.81 | 0.50 |
| 3.750 | 1.27 | 1.10E−02 | 1.452 | 4.00E−03 | 1.90 | 0.57 |
| $R_{mean}$ (μm) | 0.50 | | 0.005 | | 0.0118 | |
| $R_{std}$ (σ) | 2.99 | | 2.99 | | 2.00 | |

(b) Obtaining spectral AOD derivatives s2: Based on the spectral AODs of the various aerosol types, NDAIs are used for calculation to derive particle-size distributions and complex refractive indices from first- and second-order derivatives of the spectral AODs of the various aerosol types for examination and to construct intrinsic parameters of the various aerosol types for calculating main components of aerosols and mixing ratios thereof.

According to traditional formula, a first-order derivative of spectral AOD of gap between $\lambda_1$ and $\lambda_2$ is figured out as shown in Eq.(1), which reflects the particle-size distribution as covering the influence of AOD yet unable to single out particle size information. For removing the influence of AOD, the present invention improves the first-order derivative, as shown in Eq.(2), which is defined as a normalized aerosol index. With the building of the normalized aerosol index, the affect of AOD on the particle-size distribution is greatly reduced, where the particle-size distributions of the DS, BB (black carbon), and AP (sulfate and nitrate) are clearly distinguished.

$$\frac{\partial\tau}{\partial\lambda} \approx \nabla\tau_{(\lambda_1,\lambda_2)} = \frac{\tau_{\lambda_1} - \tau_{\lambda_2}}{\Delta\lambda} = \tau_{\lambda_2} \times (1 - A^{\alpha}) \times B \tag{1}$$

$$NDAI_{(\lambda_1,\lambda_2)} \equiv \nabla\tau_{(\lambda_1,\lambda_2)}/\tau_{\lambda_{ref}}, \tag{2}$$

where $\Delta\lambda=\lambda_2-\lambda_1$, $A=\lambda_2/\lambda_1$ and $B=1/(\lambda_2-\lambda_1)$ are constants of specific bands; λ is a wavelength (μm); α is an Ångstrom exponent (AE, related to particle-size distribution); $\nabla\tau_{(\lambda_1,\lambda_2)}$ is a first-order derivative of spectral AOD of gap between $\lambda_1$ and $\lambda_2$; $\tau_{\lambda_{ref}}$ is a normalization reference of various AOD size; and $NDAI_{(\lambda_1,\lambda_2)}$ is a spectral derivative of gap between $\lambda_1$ and $\lambda_2$ as being normalized with $\tau_{\lambda_{ref}}$.

The second-order derivative of AOD spectrum (as shown in Eq.(3)) is related to the imaginary number part of the refractive index. After being normalized (as shown in Eq.4)), features of and differences between the various aerosol types on scattering and absorption are described to distinguish and identify the various aerosol types.

$$\frac{\partial^2\tau}{\partial\lambda^2} \cong \nabla^2\tau_{(\lambda_1,\lambda_2,\lambda_3)} = \frac{(\tau_{\lambda_1} - 2\tau_{\lambda_2} + \tau_{\lambda_3})}{(\lambda_1 - \lambda_2)(\lambda_2 - \lambda_3)} \tag{3}$$

$$\frac{\partial^2\tau}{\partial\lambda^2}/\tau_{\lambda_{ref}} \cong \nabla^2\tau_{(\lambda_1,\lambda_2,\lambda_3)}/\tau_{\lambda_{ref}} = \frac{(\tau_{\lambda_1} - 2\tau_{\lambda_2} + \tau_{\lambda_3})/\tau_{\lambda_{ref}}}{(\lambda_1 - \lambda_2)(\lambda_2 - \lambda_3)}, \tag{4}$$

where $\tau_{\lambda_{ref}}$ is selected from $\tau_{\lambda_1}$, $\tau_{\lambda_2}$, and $\tau_{\lambda_3}$ to bind a dynamic range to the spectral derivative of a various aerosol type.

For distinguishing AODs in a mixed aerosol of two main components comprising A-type component and B-type component, the change of AOD depends on the AOD fraction (fAOD) for each type. As shown in Eq.(5), $$\Delta\tau_{(\lambda_1,\lambda_2)}{}^{ABmixed}=f_{AOD}{}^{A}\Delta\tau_{(\lambda_1,\lambda_2)}{}^{A}+f_{AOD}{}^{B}\Delta\tau_{(\lambda_1,\lambda_2)}{}^{B} \quad (5),$$

where $f_{AOD}{}^{A}$ and $f_{AOD}{}^{B}$ are the fAOD(NDAI) in the spectrum $(\lambda_1,\lambda_2)$ of the mixed aerosol comprising the A-type component and B-type component; and $f_{AOD}{}^{A}+f_{AOD}{}^{B}=1$. Based on Eq.(2), Eq.(5) further derives Eq.(6) based on the normalized aerosol index.

$$NDAI_{(\lambda_1,\lambda_2)}{}^{ABmixed}=\nabla\tau_{(\lambda_1,\lambda_2)}{}^{ABmixed}/\tau_{ref}=f_{AOD}{}^{A}NDAI_{(\lambda_1,\lambda_2)}{}^{A}+f_{AOD}{}^{B}NDAI_{(\lambda_1,\lambda_2)}{}^{B} \quad (6)$$

Eq.(6) is the theoretical basis for calculating the fraction ratios of the main components in the mixed aerosol based on the normalized aerosol index. With the coordination of the optical intrinsic parameters of the various aerosol types built with the normalized aerosol indices, specific ratios of the various aerosol types are obtained as shown in Eq.(7).

$$f_{AOD}^{A}=\frac{NDAI_{(\lambda_1,\lambda_2)}^{mean-A}-NDAI_{(\lambda_1,\lambda_2)}^{ABmixed}}{NDAI_{(\lambda_1,\lambda_2)}^{mean-A}-NDAI_{(\lambda_1,\lambda_2)}^{mean-B}};\ f_{AOD}^{B}=1-f_{AOD}^{A}, \quad (7)$$

where $NDAI_{(\lambda_1,\lambda_2)}{}^{mean\text{-}A}$ and $NDAI_{(\lambda_1,\lambda_2)}{}^{mean\text{-}B}$ are intrinsic parameters of A-type aerosol and B-type aerosol; and $NDAI_{(\lambda_1,\lambda_2)}{}^{ABmixed}$ is an intrinsic parameter of A/B mixed-type aerosol. Thus, a novel method of spectral AOD derivatives for partitioning type and loading is obtained.

The following states-of-use are only examples to understand the details and contents of the present invention, but not to limit the scope of patent of the present invention.

For actual measurement, the main observation data are the spectral AOD data obtained through long-term observation of the Aerosol Robotic Network (AERONET) observation stations distributed globally, which comprises main source areas of DS, BB (black carbon) and AP (sulfate and nitrate). As shown in Table 2, the control data set and verification data set obtained from the AERONET are used to identify aerosol type.

TABLE 2

| Control data set (used to construct NDAI) | | |
|---|---|---|
| DS<br>April-May | BB<br>March-May | AP<br>August-<br>September |
| Beijing<br>(39 N, 116 E)<br>2001-2012 | Chiang Mai<br>(18 N, 98 E)<br>2006-2012 | Beijing<br>(39 N, 116 E)<br>2001-2012 |
| Dalanzadgad<br>(43 N, 104 E)<br>1997-2012 | Mukdahan<br>(16 N, 104 E)<br>2003-2010 | Hong Kong<br>(22 N, 114 E)<br>2005-2012 |
| Solar Village<br>(24 N, 46 E)<br>1998-2012 | Pimai<br>(15 N, 102 E)<br>2003-2008 | Taihu<br>(31 N, 120 E)<br>2005-2012 |
| Tamanrasset<br>(22 N, 5 E)<br>2006-2012 | | Taipei<br>(25 N, 121 E)<br>2002-2012 |

TABLE 2-continued

| Validation data set (used to evaluate NDAI) | | |
|---|---|---|
| DS<br>April-May<br>(2014-2016) | BB<br>March-May<br>(2014-2016) | AP<br>August-<br>September<br>(2014-2016) |
| Beijing<br>(39 N, 116 E) | Chiang Mai<br>(18 N, 98 E) | Beijing<br>(39 N, 116 E) |
| La Laguna<br>(28 N, 16 W) | Doi Ang Khang<br>(19 N, 99 E) | Durban UKZN<br>(30 S, 31 E) |
| XuZhou<br>(34 N, 117 E) | Luang Namtha<br>(20 N, 101 E) | Hong Kong<br>(22 N, 114 E) |
| Zinder Airport<br>(14 N, 9 E) | Maeson<br>(19 N, 99 E) | La Laguna<br>(28 N, 16 W) |
| | Mongu Inn<br>(15 S, 23 E) | Mongu Inn<br>(15 S, 23 E) |
| | NhaTrang<br>(12 N, 109 E) | Taihu<br>(31 N, 120E) |
| | Omkoi<br>(17 N, 98 E) | Taipei<br>(25 N, 121 E) |
| | Silpakorn Univ<br>(13 N, 100 E) | XuZhou<br>(34 N, 117 E) |
| | Ubon Ratchathani<br>(15 N, 104 E) | |
| | Vientiane<br>(17 N, 102 E) | |

[Experiment Result and Analysis]

Theoretical Spectral AOD Derivatives

Figure 2:
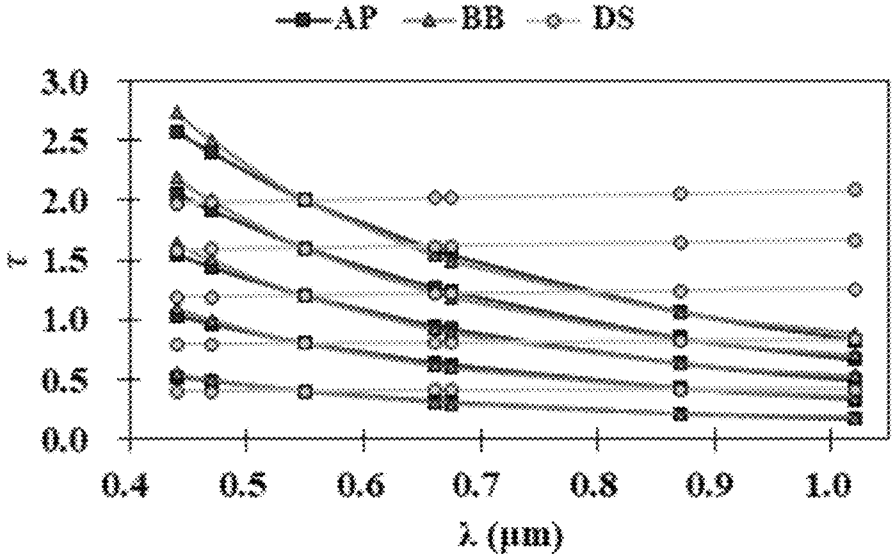
FIG. 2 is the view showing the spectral distributions of the spectral aerosol optical depths (AOD)

The spectral distributions of different AODs at specific wavelengths (0.44 μm, 0.47 μm, 0.55 μm, 0.66 μm, 0.675 μm, 0.87 μm, and 1.02 μm) are simulated based on the 6S experimental data set using various aerosols (i.e. Table 1); and a Bezier curve method is used in FIG. 2 to connect discrete points. The circular data points in the figure are the spectrum distributions of DS aerosol, which shows a flat trend with a small increase in wavelength; and the square data points and triangular data points are the spectral distributions of AP and BB aerosols, respectively, which tends to decrease continuously as similar to traditional research results. As AE indices show, the spectral gradient is mainly related to particle-size information, which shows that the radius of DS aerosol is much larger than the radius of AP and BB aerosols. Although similar particle sizes may increase the difficulty of distinguishing AP from BB, their spectral gradients are still slightly different. Besides, it is worth noting that, even for the same type, the spectral gradient of AOD may also vary with the optical depth ($AOD_{(0.55\ \mu m)}$=0.4, 0.8, 1.2, 1.6 and 2.0).

Figure 3A:
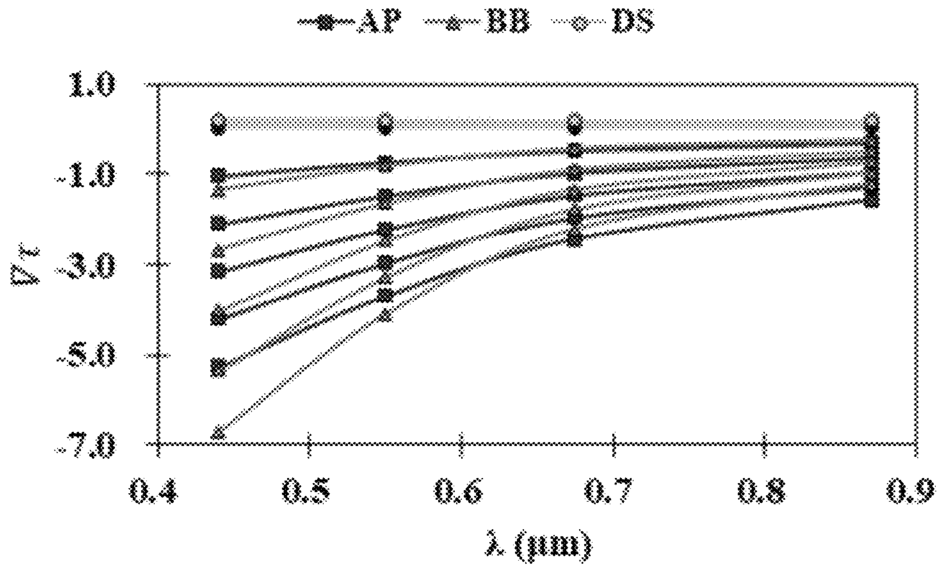
FIG. 3A is the view showing the first-order derivatives of the unnormalized AODs.
Figure 3B:
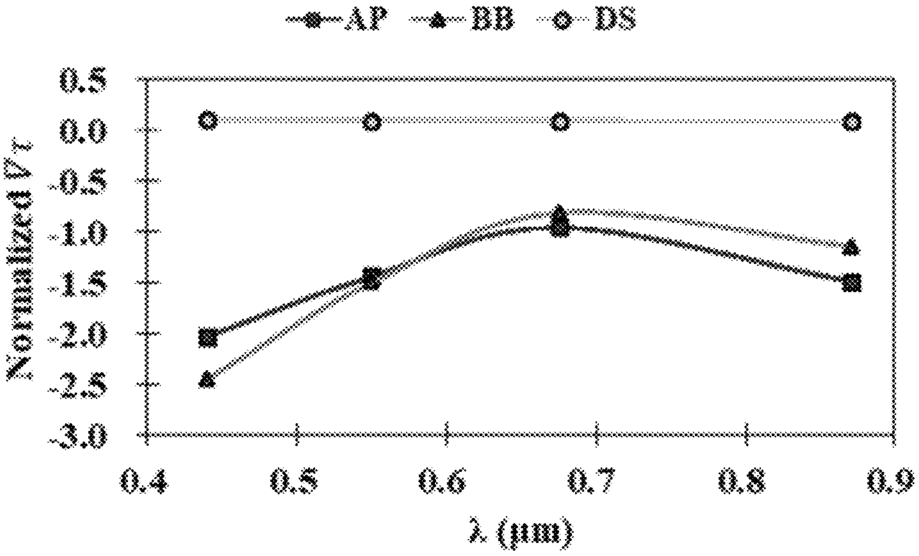
FIG. 3B is the view showing the first-order derivatives of the normalized AODs.
Figure 3C:
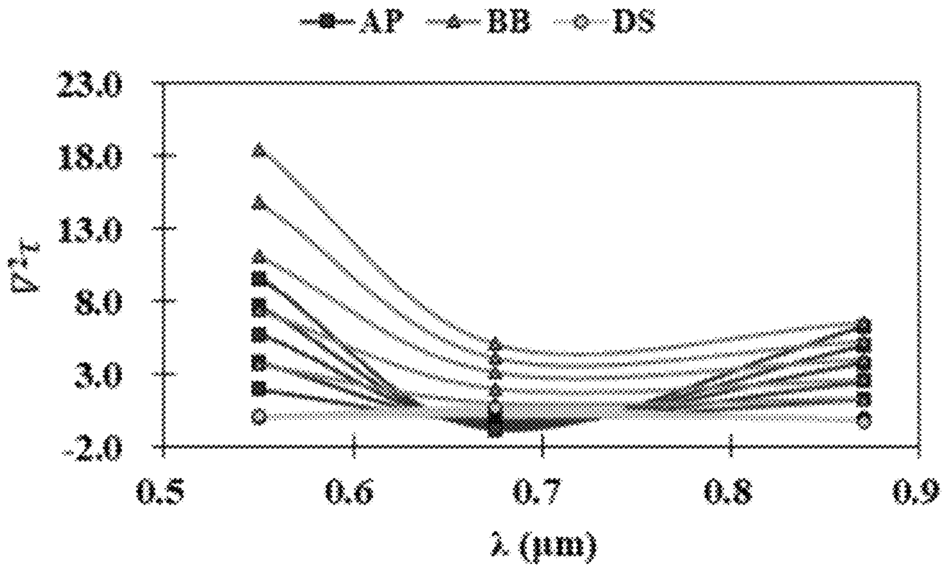
FIG. 3C is the view showing the second-order derivatives of the unnormalized AODs.
Figure 3D:
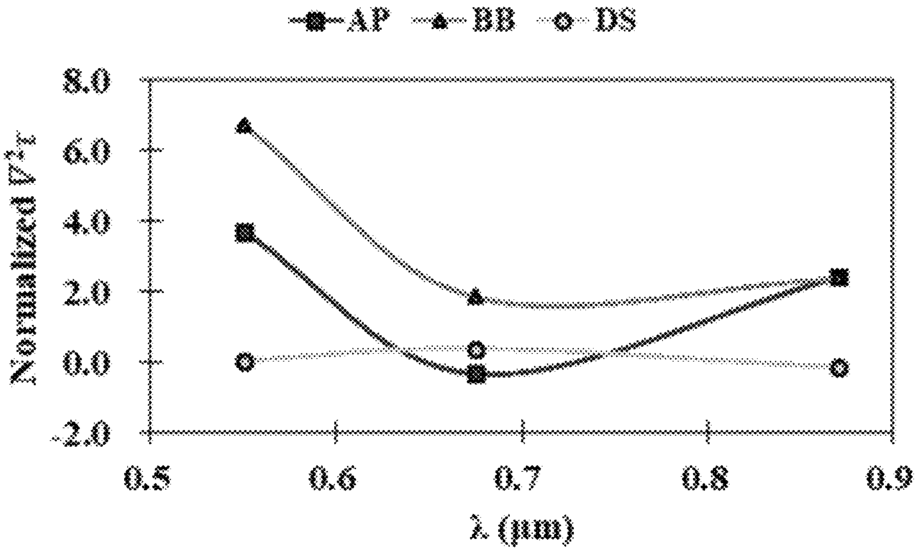
FIG. 3D is the view showing the second-order derivatives of the normalized AODs.

As shown in FIG. 2, it may be difficult to distinguish AP and BB aerosols in the zero-order spectrums by simply simulating the detailed changes in the spectral AODs. However, spectral derivative can promote the identification of subtle changes in AODs caused by different scattering and absorption. Hence, spectral derivative is related to particle-size distribution and complex refractive index for enhancing aerosol intrinsic feature. Based on the data shown in FIG. 2, FIG. 3A describes first-order derivatives of AODs and $\nabla\tau_{(\lambda_1,\lambda_2)}$, which are the spectrum pairs of 0.44-0.55 μm, 0.55-0.675 μm, 0.675-0.87 μm, and 0.87-1.02 μm from DS, AP, and BB aerosols, respectively. Different curves with the same shape of data points represent $AOD_{(0.55\ \mu m)}$ values of 0.4, 0.8, 1.2, 1.6, and 2.0, respectively. The values of DS aerosol become almost flat along wavelengths (i.e., they all tend to be zero). Obviously, except DS (due to the flat distribution of spectral AODs), the difference of $\nabla\tau_{(\lambda_1,\lambda_2)}$ between AP and BB aerosols becomes more obvious in the shorter wavelength spectrums following AOD changes and deviates. For the second-order derivatives of AOD before normalization, each of the three groups of DS, AP, and BB aerosols has three continuous spectral AODs (0.44-0.55-0.675 μm, 0.55-0.675-0.87 μm, and 0.675-0.87-1.02 μm) as shown in FIG. 3C. Although the difference between AP and BB aerosols can be further magnified in terms of $\nabla^2\tau$, the value of the second-order derivative still depends on AOD size, which is similar to $\nabla\tau_{(\lambda_1,\lambda_2)}$ as shown in FIG. 3A. On acquiring intrinsic features, both the first- and second-order derivatives are important for normalization as shown in FIG. 3B and FIG. 3D. After normalization using $AOD_{(0.44\ \mu m)}$, each type of curve under different AOD begins to merge into its own intrinsic spectrum. The optical intrinsic parameters of DS, AP, and BB aerosols effectively eliminate AOD effect.

According to the above simulation results, the first- and second-order derivatives of the unnormalized AODs are still affected by AOD size. But, as shown in FIG. 3A and FIG. 3C, a closely-overlapped line is obtained after normalization; and the intrinsic parameters of the particle-size distributions and scattering/absorption of various aerosols are clearly shown in FIG. 3B and FIG. 3D.

When different types of aerosols are mixed, the optical features are usually diverse. Thus, the first- and second-order derivatives are used to discuss the dynamic range caused by the mixing effect of DS, AP, and BB aerosols. As shown in FIG. 4A to FIG. 4F., the pre- and post-normalized first- and second-order derivatives (FIG. 4A and FIG. 4C vs. FIG. 4B and FIG. 4D) are compared for AOD ($\tau_{0.44\ \mu m}$) based on the spectral AODs at 0.44 μm, 0.675 μm, and 0.87 μm. In the figures, the triangle-symbolized BB, the square-symbolized AP, and the circle-symbolized DS aerosols have their area positions proved by the first- and second-order derivatives before and after normalization (FIG. 4E and FIG. 4F). Therein, the dotted lines between the symbols represent the dynamic ranges of mixed DS-AP, DS-BB and AP-BB aerosols.

Figure 4A:
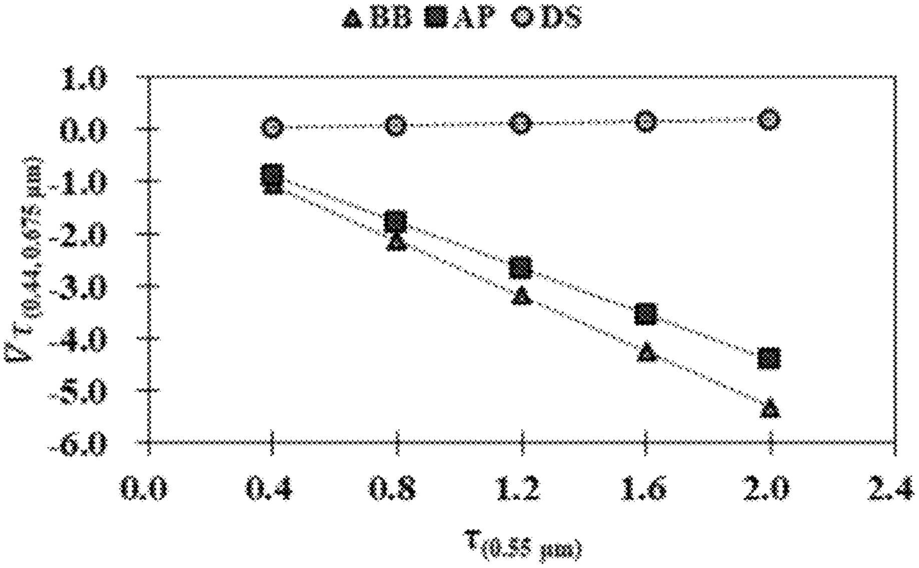
FIG. 4A is the view showing the unnormalized first-order parameters.
Figure 4B:
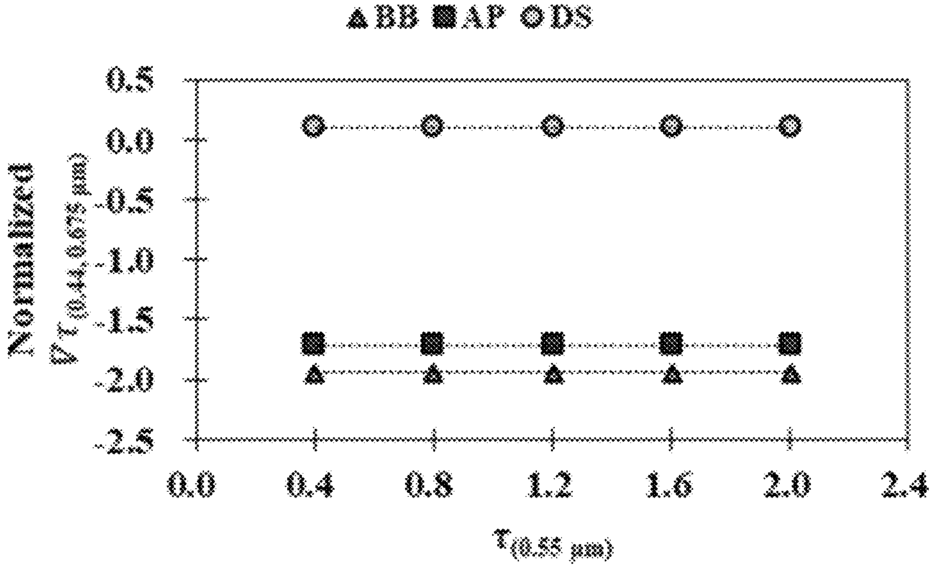
FIG. 4B is the view showing the normalized first-order parameters.
Figure 4C:
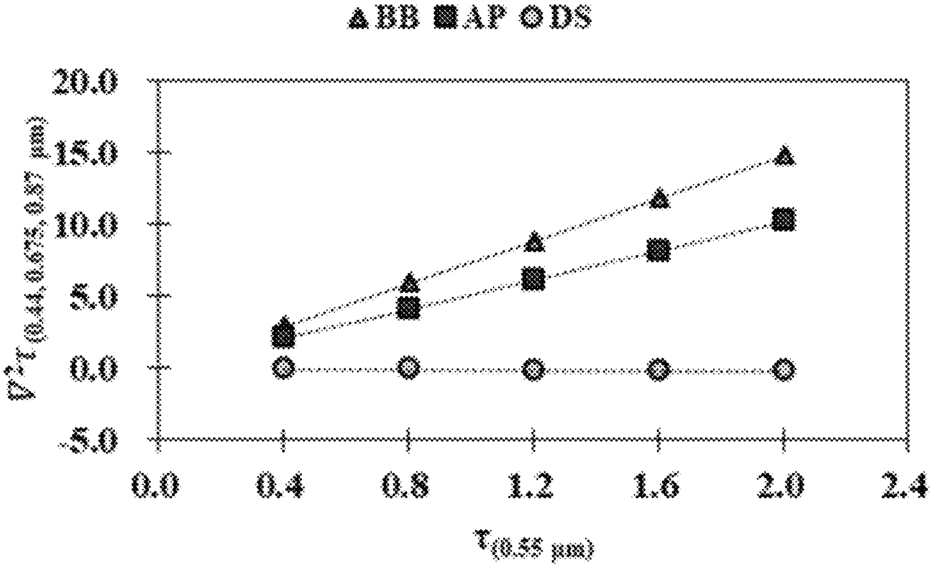
FIG. 4C is the view showing the unnormalized second-order parameters.
Figure 4D:
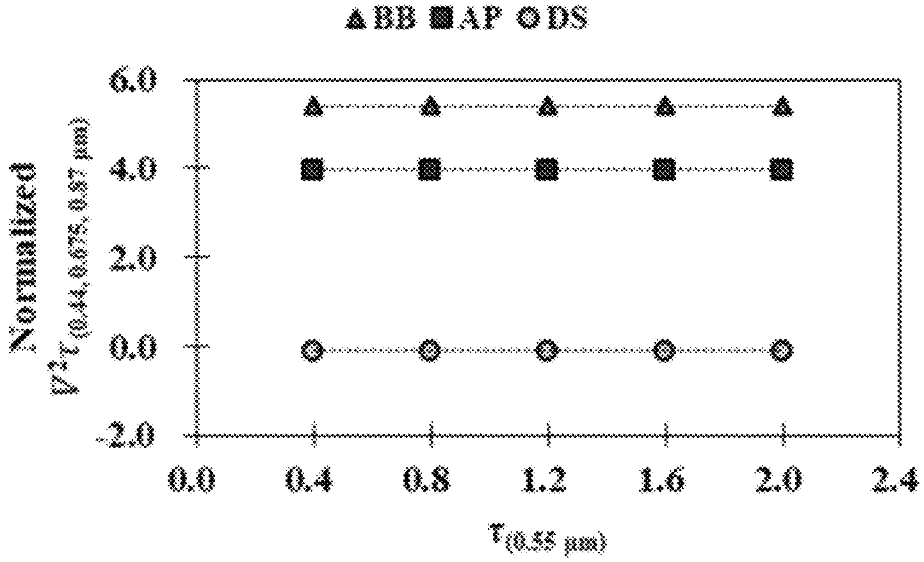
FIG. 4D is the view showing the normalized second-order parameters.
Figure 4E:
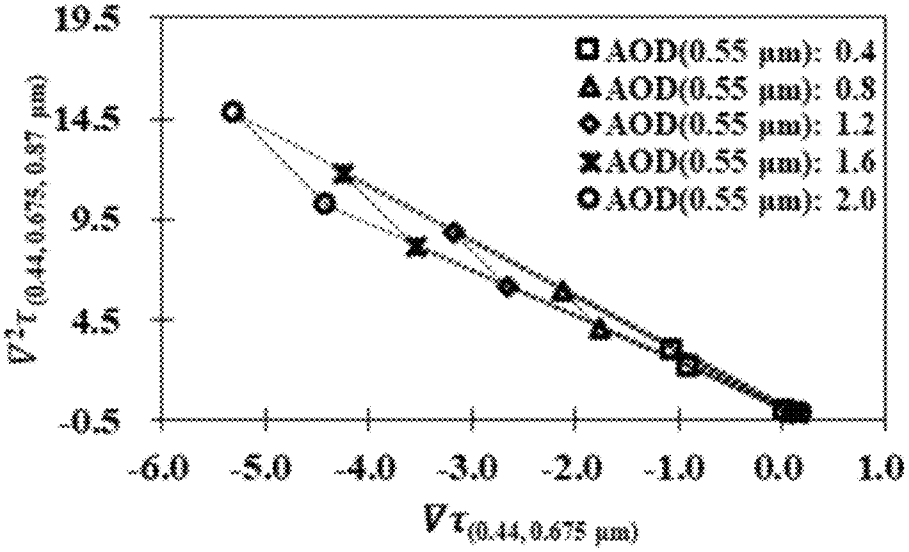
FIG. 4E is the view showing the unnormalized second-order derivatives of the AOD intrinsic features.
Figure 4F:
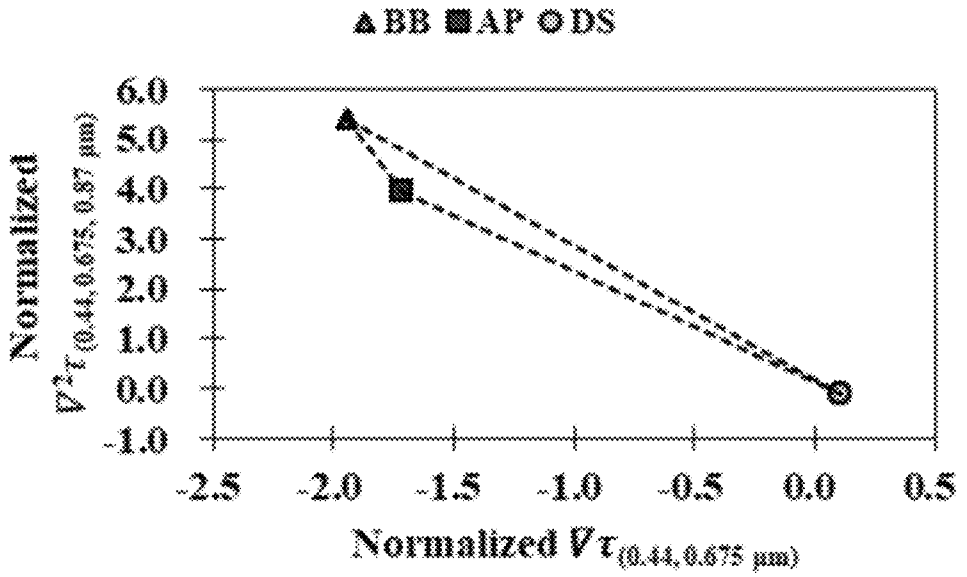
FIG. 4F is the view showing the normalized second-order derivatives of the AOD intrinsic features.

As shown in the results, FIG. 4B, FIG. 4D, and FIG. 4F show that the normalized first- and second-order derivatives do not change as following the changes in AODs, which highlights the importance of the normalization in acquiring intrinsic parameters of particle-size distribution and scattering/absorption. The measurement of spectral AOD derivatives is shown exactly as the first derivatives of the spectral AODs ($\nabla_{(0.44,0.675)}$), where both 6S-model simulation (shown in diagram (a) of FIG. 5) and the AERONET measurement (shown in diagram (b) of FIG. 5) reveal the changes of particle size (α) and AOD (τ). Furthermore, the slope of each aerosol type in the theoretical simulation is more consistent with the in-situ measurement, which strongly supports the NDAI method proposed in the present invention.

Figure 5:
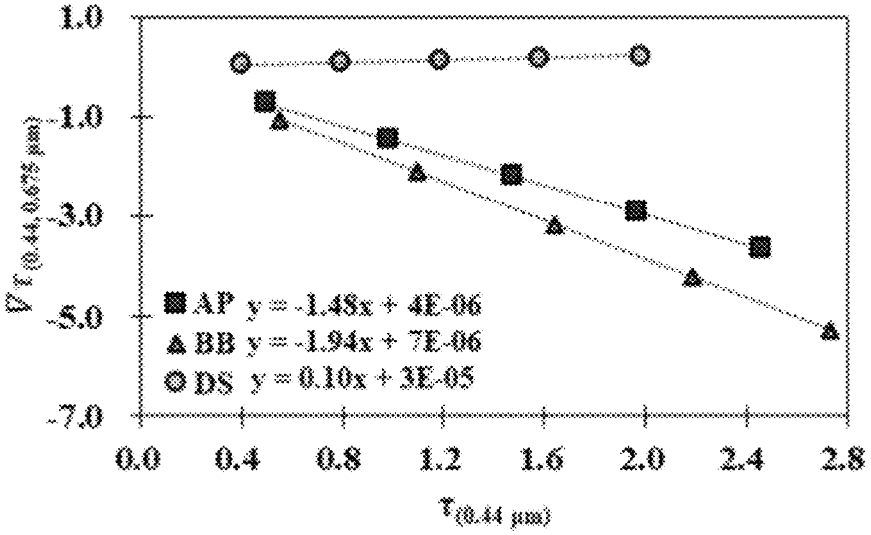
FIG. 5 is the view showing the result integrating theoretical simulation and actual observation.
Figure 5:
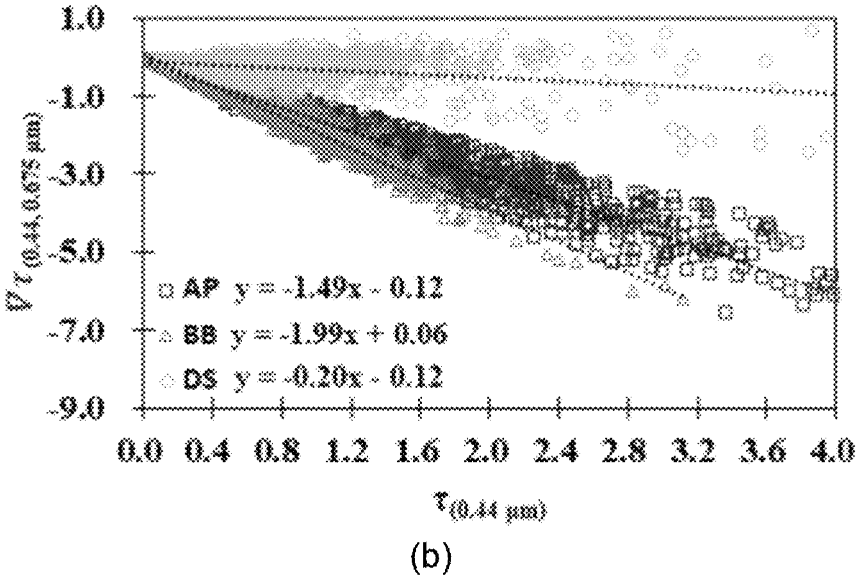
Figure 6:
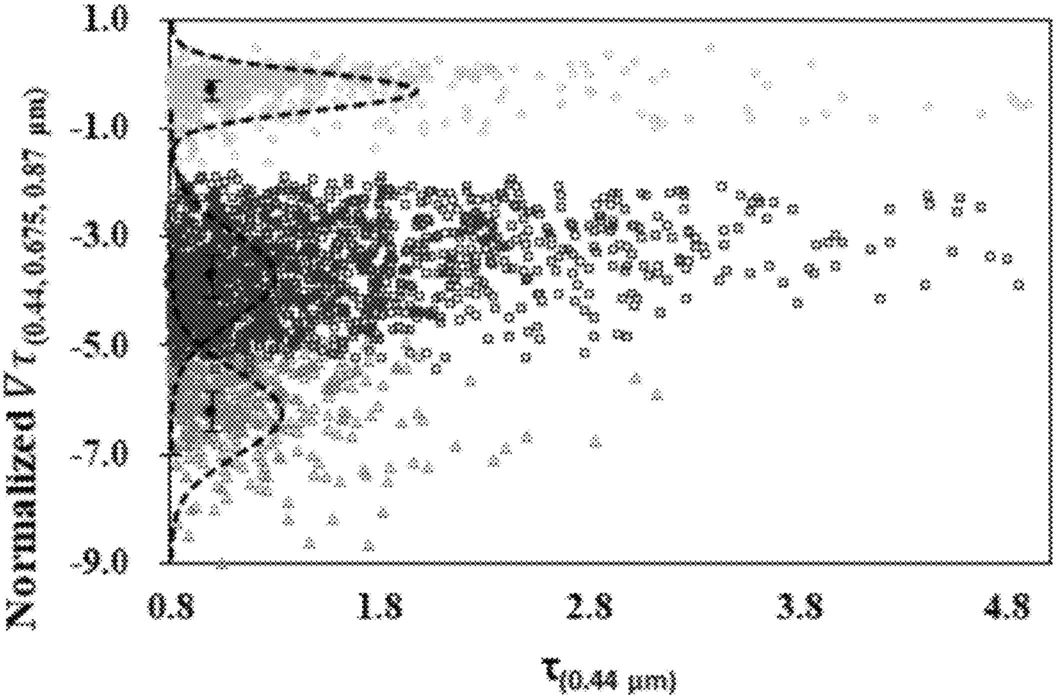
FIG. 6 is the view showing the result integrating theoretical simulation and actual observation by using the normalized aerosol indices.

Based on the data set used in diagram (b) of FIG. 5, FIG. 6 processes the filtration of $AOD_{(0.44\ \mu m)}>0.8$ under Single Scattering Albedo (SSA) and normalizes the result through $AOD_{(0.87\ \mu m)}$. Besides, the mapping (dashed line) for normal distribution and the average value (black dot) are also indicated.

In the above results shown in the figures, the result of the first-order derivatives (particle-size distribution) of the ground observation data (AERONET) before and after normalization (FIG. 5 v.s. FIG. 6) strongly supports the result of the theoretical simulation (shown in FIG. 4A-FIG. 4F), where various aerosol types can be clearly distinguished (shown in FIG. 6).

Figure 7:
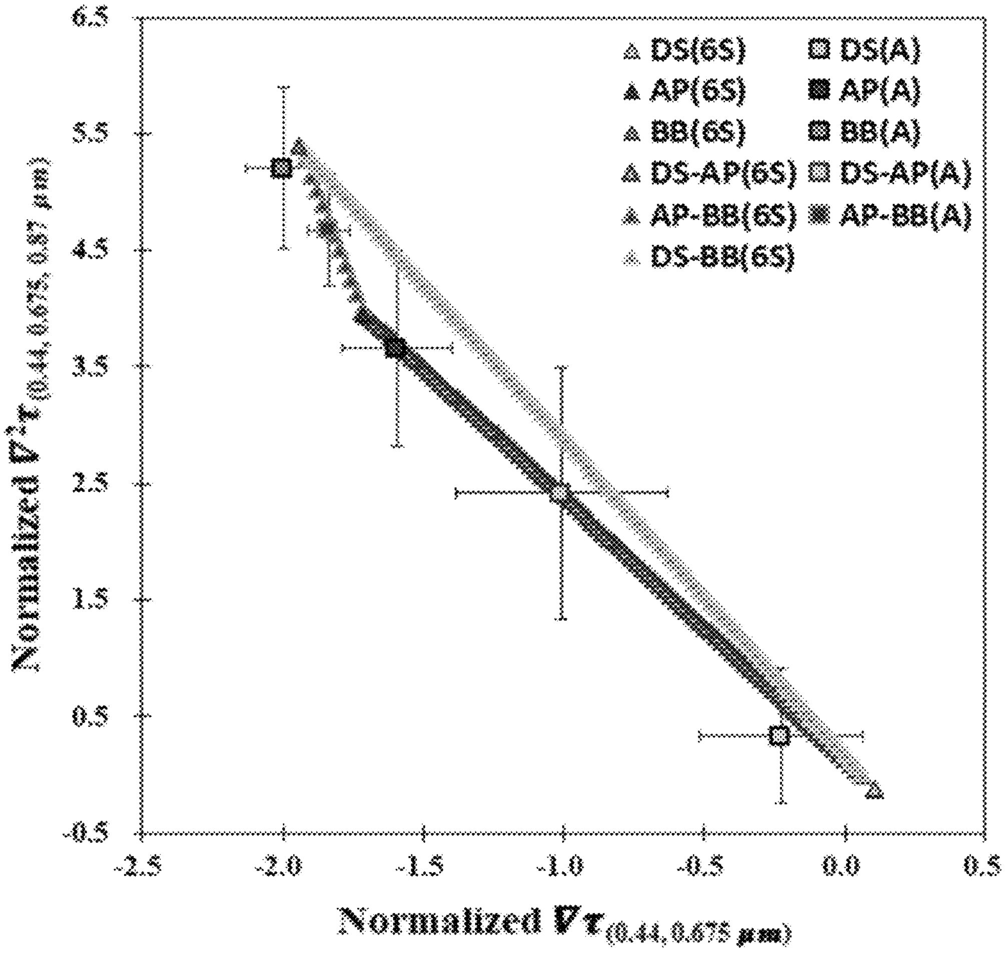
FIG. 7 is the view showing the normalized first- and second-order derivatives of the data of ground observation and theoretical simulation.
Figure 8A:
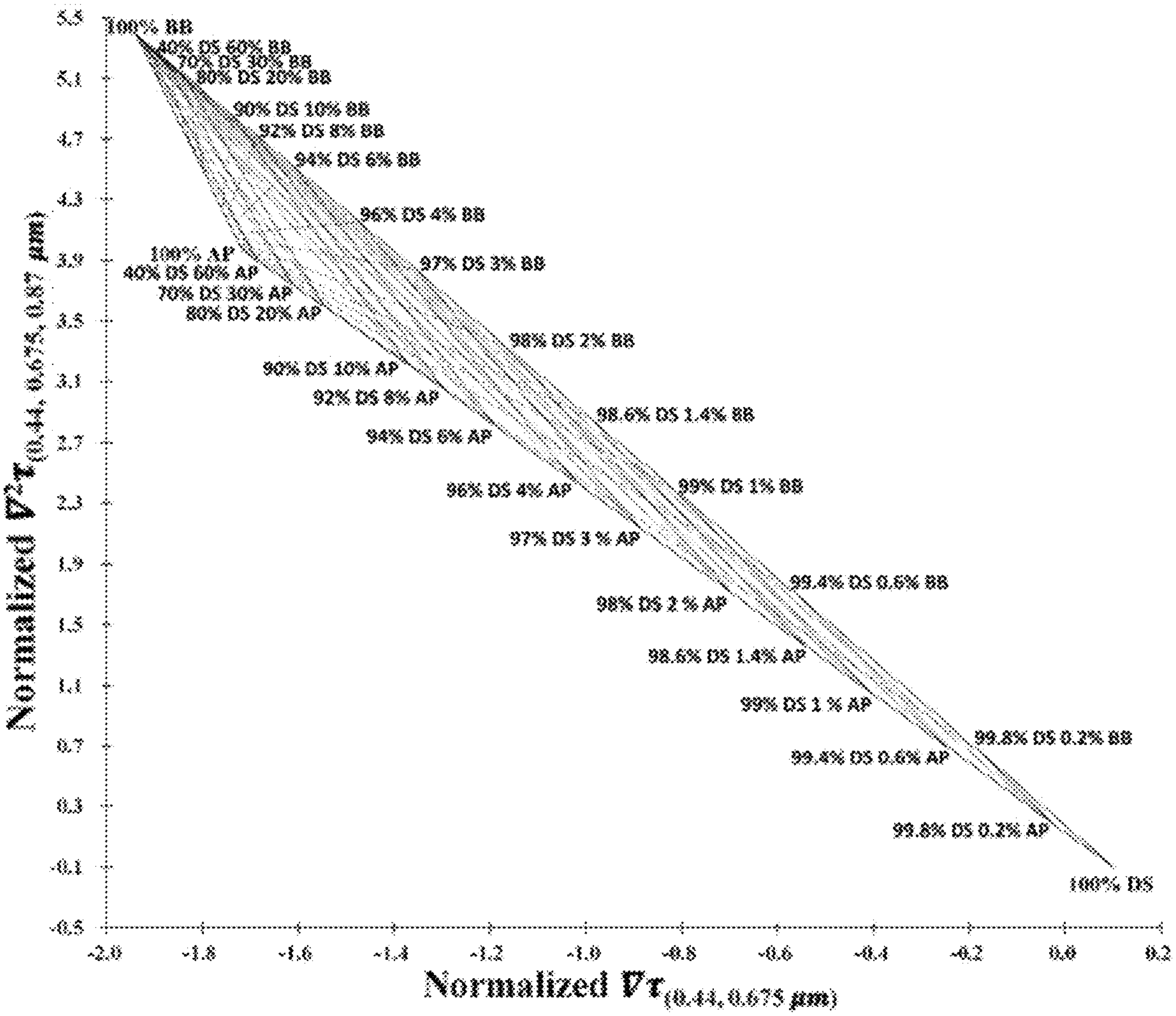
FIG. 8A and FIG. 8B are the views showing the component proportions of the three representative aerosols.
Figure 8B:
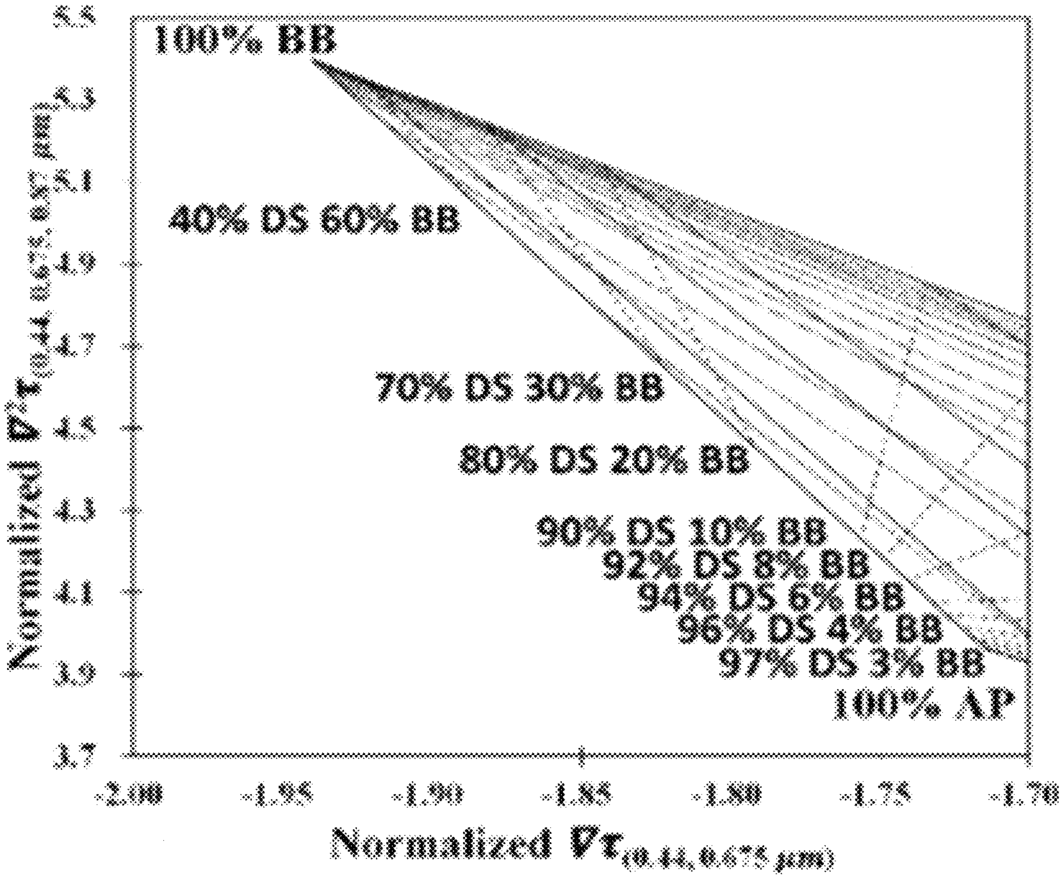

FIG. 7 shows that the second-order derivatives (normalized $\nabla 2\tau$) and first-order derivatives (normalized $\nabla\tau$) of two-component aerosol mixtures (DS-BB, DS-AP, and AP-BB, denoted with "6S") are obtained to process simulation through the mixed volume/density weights for the 6S model in 0.01 steps from 0.00 to 1.00. The ground observation data (AERONET) and the average value and standard deviation of the spectral derivatives of DS, AP, BB, DS-AP, DS-BB, and AP-BB aerosols are configured together.

FIG. 7 shows the comparison between the first- and second-order derivatives of the data of the ground observation (AERONET) and the theoretical simulation, where a good consistency is shown in the figure and the normalized first- and second-order derivatives of the spectral AODs constructed by the present invention have considerable feasibility and application value in identifying and quantifying aerosol types.

Regarding practical applications, the present invention often applies to a variety of mixed aerosols, where the component proportions of three global representative aerosols are constructed through theory, comprising DS, BB (black carbon), and AP (sulfate and nitrate), for practical observation applications. As with the result shown in FIG. 8A and FIG. 8B, the first-order derivative (VT) is the optical features of particle-size distribution at 0.44 μm and 0.675 μm calculated for the mixed weights of volume and density in 0.01 steps from 0.00 to 1.00. In contrast, the second-order derivatives ($\nabla^2\tau$) are the calculated optical features related to refractive indices at 0.44 μm, 0.675 μm, and 0.87 μm. It means that, with the mixed volume/density weights of the three-component mixtures (i.e. mixture of DS, AP, and, BB aerosols) in the 6S model, the normalized second-order derivatives ($\nabla^2\tau$, related to refractive index at 0.44 μm, 0.675 μm, and 0.87 μm) of $AOD_{(0.47\ \mu m)}$ is used to process simulation for the first-order derivatives (VT, related to particle-size distribution at 0.44 μm and 0.675 μm) in 0.01 steps from 0.00 to 1.00. In this way, with the calculated first-order (X-axis) and second-order (Y-axis) derivatives of the spectral AODs, corresponding aerosol types and their proportions can be found according to the database of FIG. 8A and FIG. 8.B.

It is still a challenge to quantify the compositions of aerosols (atmospheric particulate matter) with the data obtained from satellite telemetry or ground observation. Based on multi-spectral AODs, particle-size distributions and refractive indices are derived by normalizing first- and second-order derivatives for processing quantitative calibration of main components. At first, according to the optical feature parameters of various aerosol types (DS, BB, and AP), a radiation theory (6S model) is applied to simulate the multi-spectral optical depth for each density, including those of mixed types. The intrinsic parameters of the aerosol types are figured out with the normalized derivative aerosol index (NDAI) constructed according to the present invention. The apparent differences between the features of aerosols are used to figure out the main components of any specific aerosol and its mixing ratio. A simulation result of the NDAIs of the various aerosol types derived through applying the theory proposed in the present invention is in good agreement with the ground observation data of AERONET. It shows that the NDAI constructed according to the present invention is quite practicable in the quantitative calibration of the main components of atmospheric aerosols.

Hence, the main contributions of the present invention are as follows:

1. First- and second-order derivatives obtained through multi-spectral AOD normalization is applied for identifying and quantitatively distinguishing aerosol types.

2. The potential of satellite applications is obtained for providing global or regional distributions of aerosol types.

3. Information of the temporal and spatial distribution of SSA having very scarce global observation data can be provided.

To sum up, the present invention is a method of spectral AOD derivatives for partitioning type and loading, where NDAI is used to integrate data of theoretical simulation and actual observation for examining various aerosol types with the relationships of particle-size distributions and complex refractive indices together with first- and second-order derivatives of spectral AODs and constructing optical intrinsic parameters of DS, BB, and AP; and, thus, each single type of aerosol is identified and main components of each mixed aerosol are quantitatively distinguished.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of calculating spectral derivatives of aerosol optical depth (AOD) comprising:

measuring optical feature parameters of various mixed aerosol types including dust (DS), biomass burning (BB), anthropogenic pollutants (AP), and mixtures of DS, BB, and AP;

determining a Second Simulation of a Satellite Signal in the Solar Spectrum (6S) model by calculating spectral AODs of said various mixed aerosol types;

calculating normalized derivative aerosol indices (NDAI) based on the spectral AODs, thereby obtaining particle-size distributions and complex refractive indices derived from normalized first- and second-order derivatives of said spectral AODs of said various mixed aerosol types and intrinsic parameters of said various mixed aerosol types; and calculating main components of the mixed aerosols and mixing ratios thereof identifying each single type of aerosol and quantitatively distinguishing main components of the mixed aerosols.

2. The method according to claim 1, wherein a main component of said BB is black carbon and main components of said AP are sulfate and nitrate.

3. The method according to claim 1, wherein said optical feature parameters of said various mixed aerosol types are measured particle-size distributions and complex refractive indices provided by the World Meteorological Organization (WMO).

4. The method according to claim 1, wherein, with the normalization of said first-order derivatives of said spectral AODs of said various aerosol types, said particle-size distributions of DS, BB, and AP are clearly distinguished by an equation as follows:

$$NDAI_{(\lambda_1,\lambda_2)} \equiv \nabla\tau_{(\lambda_1,\lambda_2)}/\tau_{\lambda_{ref}},$$

wherein $\lambda$ is a wavelength (micrometer, μm); $\nabla\tau_{(\lambda_1,\lambda_2)}$ is a first-order derivative of spectral AOD of gap between $\lambda_1$ and $\lambda_2$; $\tau_{\lambda_{ref}}$ is a normalization reference of loading of spectral AOD; and $NDAI_{(\lambda_1,\lambda_2)}$ is a spectral derivative of gap between $\lambda_1$ and $\lambda_2$ as being normalized with $\tau_{\lambda_{ref}}$.

5. The method according to claim 1, wherein, normalizing the second-order derivatives of said spectral AODs of said various mixed aerosol types, distinguishes and identifies features of and differences between said various mixed aerosol types [[on]] with respect to scattering and absorption by an equation as follows:

$$\frac{\partial^2\tau}{\partial\lambda^2}/\tau_{\lambda_{ref}} \cong \nabla^2\tau_{(\lambda_1,\lambda_2,\lambda_3)}/\tau_{\lambda_{ref}} = \frac{(\tau_{\lambda_1} - 2\tau_{\lambda_2} + \tau_{\lambda_3})/\tau_{\lambda_{ref}}}{(\lambda_1 - \lambda_2)(\lambda_2 - \lambda_3)},$$

wherein $\tau_{\lambda_{ref}}$ is a normalization reference of loading of spectral AOD and is selected from $\tau_{\lambda_1}$, $\tau_{\lambda_2}$, and $\tau_{\lambda_3}$ to bind a dynamic range to spectral derivative of said various aerosol type; and $\lambda$ is a wavelength.

* * * * *